US008822952B2

(12) United States Patent
Muto et al.

(10) Patent No.: US 8,822,952 B2
(45) Date of Patent: Sep. 2, 2014

(54) CHARGED PARTICLE BEAM APPARATUS HAVING NOISE ABSORBING ARRANGEMENTS

(75) Inventors: Daisuke Muto, Hitachinaka (JP); Masanori Watanabe, Hitachinaka (JP); Masaru Matsushima, Hitachinaka (JP); Shuichi Nakagawa, Hitachinaka (JP); Masahiro Akatsu, Hitachinaka (JP); Yusuke Tanba, Hitachinaka (JP); Satoshi Okada, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/883,764

(22) PCT Filed: Oct. 14, 2011

(86) PCT No.: PCT/JP2011/005748
§ 371 (c)(1),
(2), (4) Date: May 7, 2013

(87) PCT Pub. No.: WO2012/063406
PCT Pub. Date: May 18, 2012

(65) Prior Publication Data
US 2013/0228686 A1  Sep. 5, 2013

(30) Foreign Application Priority Data
Nov. 9, 2010 (JP) .................. 2010-250386

(51) Int. Cl.
*H01J 37/16* (2006.01)
*H01J 37/28* (2006.01)
*H01J 37/26* (2006.01)
*G10K 11/172* (2006.01)

(52) U.S. Cl.
CPC ....... *H01J 37/261* (2013.01); *H01J 2237/0216* (2013.01); *H01J 37/16* (2013.01); *H01J 37/28* (2013.01); *G10K 11/172* (2013.01)
USPC .............. 250/442.11; 250/441.11; 250/492.1; 250/492.2; 250/491.1

(58) Field of Classification Search
USPC ........ 250/492.1, 492.2, 492.3, 491.1, 441.11, 250/442.11; 254/550, 648
See application file for complete search history.

(56) References Cited

U.S. PATENT DOCUMENTS 4,223,224 A * 9/1980 Rauch ...................... 250/442.11
4,352,643 A * 10/1982 Iijima ........................... 417/313
5,179,516 A * 1/1993 Choshitani et al. ............. 700/56

(Continued)

FOREIGN PATENT DOCUMENTS

JP  2001-306078  11/2001
JP  2005-18042   1/2005

(Continued)

*Primary Examiner* — David A Vanore
(74) *Attorney, Agent, or Firm* — Antonelli, Terry, Stout & Kraus, LLP.

(57) ABSTRACT

Charged particle beam apparatus arrangements in which either a first noise absorber which provides noise absorbing performance specialized for a first frequency range including the natural frequency of the charged particle beam apparatus as reference, or a second noise absorber which provides noise absorbing performance specialized for a second frequency range including the frequency of acoustic standing waves generated within the cover as reference, or both of the first and second noise absorbers is/are disposed within a cover of the charged particle beam apparatus.

21 Claims, 8 Drawing Sheets

(56) References Cited

U.S. PATENT DOCUMENTS

| | | | |
|---|---|---|---|
| 5,765,800 A * | 6/1998 | Watanabe et al. | 248/550 |
| 6,021,991 A * | 2/2000 | Mayama et al. | 248/550 |
| 6,043,490 A * | 3/2000 | Sakai | 250/310 |
| 7,915,584 B2 * | 3/2011 | Tiemeijer et al. | 250/310 |
| 2012/0091362 A1* | 4/2012 | Tsuji et al. | 250/441.11 |
| 2013/0082194 A1* | 4/2013 | Muto et al. | 250/492.3 |

FOREIGN PATENT DOCUMENTS

| | | |
|---|---|---|
| JP | 2006-79870 | 3/2006 |
| JP | 2007-226216 | 9/2007 |
| JP | 2008-52946 | 3/2008 |
| JP | 2008-138505 | 6/2008 |
| JP | 2009-16283 | 1/2009 |
| WO | WO 2011/158458 A1 | 12/2011 |

* cited by examiner

CHARGED PARTICLE BEAM APPARATUS HAVING NOISE ABSORBING ARRANGEMENTS

TECHNICAL FIELD

The present invention relates to a charged particle beam apparatus which suffers damage to images caused by acoustic excitation. The invention pertains to a noise-proof cover which reduces noise and oscillation produced by the external environment, assuming that the noise-proof cover is used particularly in a clean room or other like places.

BACKGROUND ART

According to a charged particle beam apparatus such as an electron microscope which performs high-magnification observation using electron beams, images oscillate by external small sound pressure or oscillation. The damage caused by oscillation becomes more conspicuous as the magnification increases. For the purpose of preventing damage to images caused by application of installation environment noise, a noise-proof cover is equipped as means for interrupting transmission of sound waves applied to the apparatus. Generally, the noise-proof cover has surfaces of hexahedron structure constituted by upper and lower, left and right, and upper and lower surfaces, considering the characteristics of sound waves which can go around and enter, and further the easiness of construction and low cost.

For improving the noise proof performance of the cover, noise absorption inside the cover is effective. It is therefore effective to provide organic porous material throughout the inner surface of the cover. However, the charged particle beam apparatus is generally used within a clean room, in which case such a problem may arise that the dusting characteristics produced by splashes from the organic material deteriorate the dustproof condition of the clean room. For overcoming this problem, PTL 1 discloses a technology which covers a noise absorbing material by dustproof fibers and attaches the noise absorbing material to an external cover.

Furthermore, in the field of acoustic engineering, it is generally known that there exists a resonance frequency dependent on the shape of a flask-type vessel and produced by air oscillation at an opening of the shape of the vessel. This is called Helmholtz resonance theory, and technologies based on this theory have been developed for absorbing noise. As a structure utilizing these technologies, PTL 2 discloses a noise absorbing structure constituted by a box-shaped component having a number of small bores.

CITATION LIST

Patent Literature

PTL 1: JP-A-2006-79870
PTL 2: JP-A-2008-138505

SUMMARY OF INVENTION

Technical Problem

Currently, there is no noise-proof cover, particularly noise-proof cover used in a clean room, which absorbs noise by a structure specialized for an estimated frequency of noise produced by environmental noise, wherefore efficient noise absorption is difficult. It is therefore an object of the invention to provide a charged particle beam apparatus including a noise-proof cover structure for charged particle beam apparatus, which noise-proof cover structure has a noise absorbing structure capable of absorbing noise with high efficiency, and locates the noise absorbing structure in such a position as to achieve efficient noise absorption.

Solution to Problem

In order to solve the aforementioned problems, there is provided within a cover of a charged particle beam apparatus, either a first noise absorber which provides noise absorbing performance specialized for a first frequency range including the natural frequency of the charged particle beam apparatus as reference, or a second noise absorber which provides noise absorbing performance specialized for a second frequency range including the frequency of acoustic standing waves generated within the cover as reference, or both of the first and second noise absorbers.

Advantageous Effects of Invention

The invention can provide a noise-proof cover which efficiently absorbs the natural oscillation of a charged particle beam apparatus, and acoustic standing waves generated within the cover. The charged particle beam apparatus including this noise-proof cover can reduce damage to images caused by noise of the installation environment.

DESCRIPTION OF EMBODIMENTS

A charged particle beam apparatus discussed herein relates to apparatuses which perform highly accurate inspections, observations, and processes, such as general-purpose scanning electron microscopes, measuring apparatuses (CD-SEM), reviewing apparatuses, defect detection systems, and sample processing apparatuses using charged particle beams, and corresponds to all of the apparatuses which are damaged by small oscillation of the apparatuses.

Figure 1:
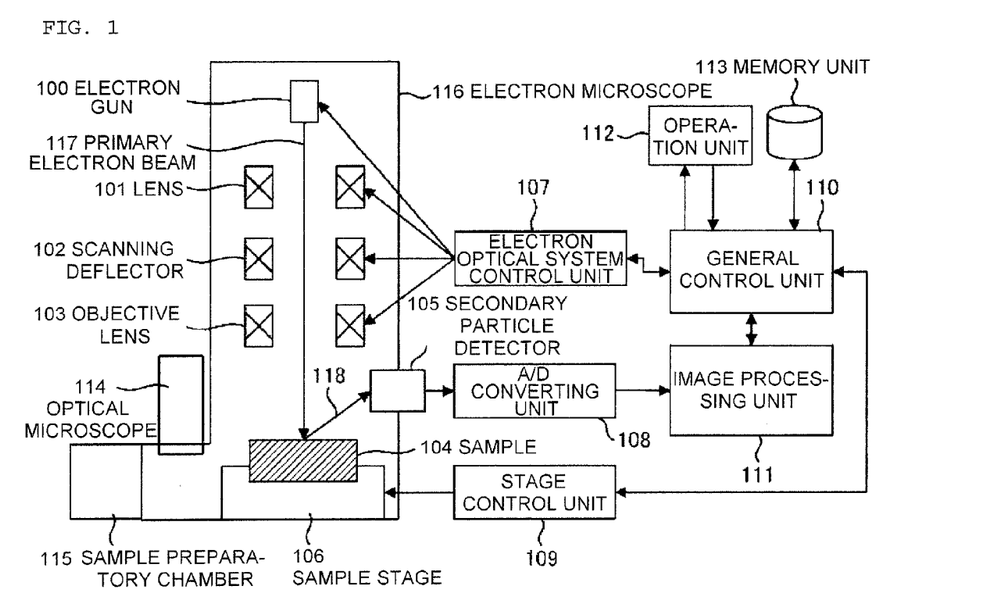
FIG. 1 illustrates the general structure of a scanning electron microscope.

FIG. 1 schematically illustrates the general structure of a scanning electron microscope as an example of the charged particle beam apparatus. The scanning electron microscope shown in FIG. 1 includes a column which has an electron optical system provided with optical elements such as an electron gun 100, a lens 101, a scanning deflector 102, an objective lens 103, a sample 104, and a secondary particle detector 105, and further includes a stage 106 which shifts a sample table supporting the sample as an observation target in a direction within an X-Y plane, an electron optical system control unit 107 which controls the respective optical elements contained in the electron optical system, an ND converting unit 108 which quantizes output signals received from the secondary particle detector 105, a stage control unit 109 which controls the stage 106, a general control unit 110, an image processing unit 111, an operation unit 112 provided with a display, a keyboard, and a pointing device such as a mouse, a memory unit 113 containing HDD, memory and others, an optical microscope 114, and other components. The electron optical system, the electron optical system control unit 107, the A/D converting unit 108, the stage 106, and the stage control unit 109 noted above constitute a scanning electron microscope corresponding to imaging means for capturing SEM images.

Initially, the sample 104 is positioned on the sample stage 106 by a loader (not shown) for carry samples, and transferred from a sample preparatory chamber 115 into an electron microscope 116.

A primary electron beam 117 discharged from the electron gun 100 is converged by the lens 101, and deflected by the scanning deflector 102. The deflected beam is converged by the objective lens 103, and applied to the sample 104. Secondary particles 118 such as secondary electrons and reflection electrons are generated from the sample 104 to which the primary electron beam 117 is applied in accordance with the shape and material of the sample. The generated secondary particles 118 are detected by the secondary particle detector 105, and converted into a digital signal by the A/D converting unit 108. The output signal of the secondary particle detector converted into the digital signal is referred to as an image signal as well. An output signal from the A/D converting unit 108 is inputted to the image processing unit 111 to form an SEM image. The image processing unit 111 performs various types of image processing such as defect detection and defect analysis based on image comparison.

The optical elements contained in the electron optical system such as the lens 101, the scanning deflector 102, and the objective lens 103 are controlled by the electron optical system control unit 107. The position of the sample is controlled by the stage 106 controlled by the stage control unit 109. The general control unit 110 is a controller which supervises and controls the entire parts of the apparatus. The general control unit 110 interprets the input from the operation unit 112 and the memory unit 113, controls components such as the electron optical system control unit 107, the stage control unit 109, and the image processing unit 111, and outputs the process results to a display unit (not shown) contained in the operation unit 112, and the memory unit 113 as necessary.

A part or the whole of the general control unit 110 and the image processing unit 111 explained above can be constituted by either hardware or software. In the case of constitution by hardware, the structure can be produced by integrating a plurality of calculators performing necessary processes on a wiring board or within a semiconductor chip or package. In the case of constitution by software, the structure can be produced by using a high-speed and general-purpose CPU which performs programs associated with execution of processes such as image processing by means of software.

Figure 2:
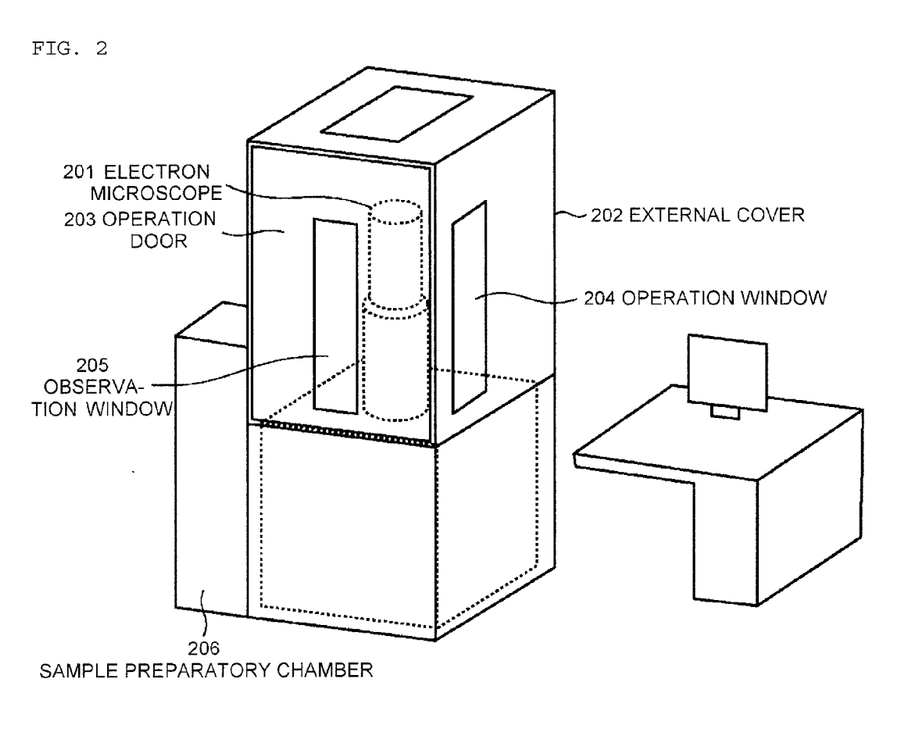
FIG. 2 illustrates the external appearance of the scanning electron microscope including a cover.

FIG. 2 illustrates the external appearance of an example of the charged particle beam apparatus. An external cover 202 is provided around the outer circumference of an electron microscope 201 in such a manner as to surround the whole of the electron microscope 201. The external cover 202 is made of sheet steel or resin. An operation door 203 and an operation window 204 provided for operation are attached to the external cover 202 so as to open and close the external cover 202. The operation window 204 is made of material such as sheet steel, resin, and glass. An observation window 205 is further attached for observation of the interior. The observation window 205 is made of glass or resin so that the interior can be monitored through the window 205. The operation door 203, the operation window 204, and the observation window 205 are parts of the external cover 202, and are collectively referred to as the external cover 202. The observation window 205 may be made of metal as long as it is of an opening and closing type.

According to the example shown in FIG. 2, only a main body of the electron microscope is contained in the external cover. However, it is obvious that a sample preparatory chamber 206 can be disposed within the external cover. Moreover, when a part or the whole of the components such as the general control unit 110 and the image processing unit 111 are constituted by hardware as noted above, the parts constituted by hardware may be surrounded by the same external housing as that of the electron microscope, or may be handled in another housing surrounded by an external casing other than the external casing of the electron microscope. However, since it is the main body of the electron microscope that requires noise proof or removal of oscillation, it is rather preferable that components such as the loader transferring samples and a control board provided with a cooling fan are contained in a separate housing, or in a space separated by partitioning walls within the housing so that oscillation sources are not included in the same housing.

Figure 3:
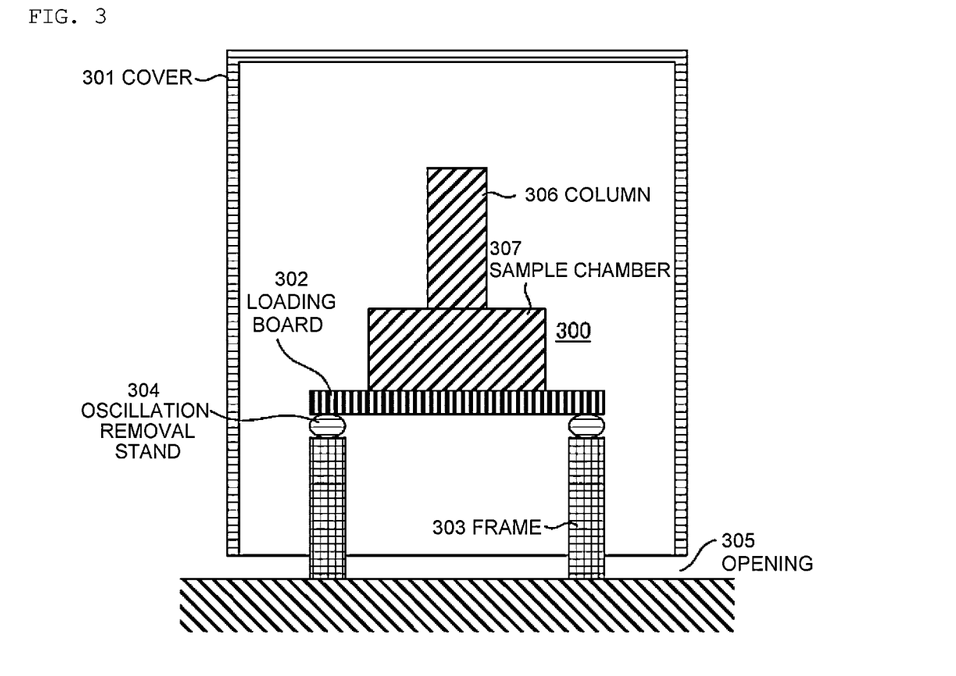
FIG. 3 is a cross-sectional view of the scanning electron microscope.

FIG. 3 is a cross-sectional view of the electron microscope and the external cover shown in FIG. 2. This figure illustrates the charged particle beam apparatus provided with a cover 301 and a loading board 302. As illustrated in FIG. 3, the loading board 302 is placed via oscillation removal stands 304 on a frame 303 which has a plurality of supports positioned on the ground. A charged particle beam apparatus main body 300 is constructed on the loading board 302 as a unit equipped with a column 306 which contains the electron optical system and a sample chamber 307 on which a sample is placed. The cover 301 is provided outside in such a manner as to cover the frame 303, the loading board 302, and the apparatus main body 300. Generally, the apparatus generates heat, and thus an opening 305 is formed below the cover 301 so that the generated heat can be released through the opening 305.

The structure of a noise absorber attached to a noise-proof cover is now explained. The noise absorber referred to below includes a part provided with a noise absorbing structure formed independently from the noise-proof cover, and a part of the structure of the noise-proof cover formed integrally with the noise-proof cover. A conventional noise absorber is generally made of organic porous material. However, the organic porous material has dusting characteristics and thus is difficult to be used within a clean room. However, when the noise absorber is made of metal material, the dusting characteristics can be considerably reduced to a level allowed to be used in the clean room.

Figure 4:
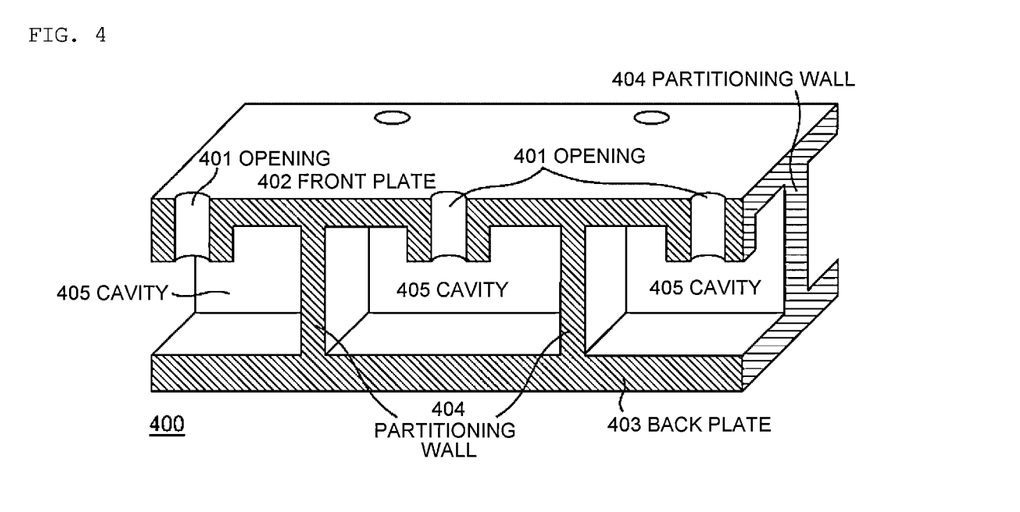
FIG. 4 illustrates the structure of a noise absorber.

For example, it is preferable that a noise absorber 400 shown in FIG. 4 is made of metal material. FIG. 4 is a specific illustration of the noise absorber 400 made of porous plate. The noise absorber 400 has a structure which includes a front plate 402 having openings 401 and fixed to a back plate 403 via partitioning walls 404, and contains cavities 405 produced by the front plate 402, the back plate 403, and the partitioning walls 404.

When air contained in the openings 401 is pushed into the cavities 405 by sound waves coming from the front plate 402 side in this structure, the pressure within the cavities 405 increases and tries to push back the air contained in the openings 401 in the opposite direction. As a consequence, a simple harmonic motion system is created by the function of the air contained in the openings 401 as a weight and the air in the cavities 405 as a spring. In this condition, energy is dissipated by friction generated between the air and the parts in the openings 401, whereby high noise absorbing performance is produced at a specific frequency. This specific frequency is determined by the opening diameter, opening length, and porosity of the openings 401, and the thickness of the cavities. A noise-proof cover specialized for the frequency of the noise chiefly generated within the noise-proof cover can be obtained by designing these factors in accordance with the frequency of the noise. It is more effective to make each length of the bores of the openings 401 variable by using tube-shaped objects embedded in the openings 401 so that the noise absorbing frequency becomes adjustable.

The frequency of the noise in this context refers to the frequency of oscillation corresponding to the target of noise to be absorbed. The frequency involves the natural frequency of the apparatus, and the frequency of acoustic standing waves within the cover, for example. These frequencies can be estimated beforehand from the sizes and masses of the apparatus and the cover, for example. Thus, high noise absorbing effect can be obtained by adjusting the absorbing frequency of the noise absorber to these noise frequencies.

When the noise absorber 400 exhibits the maximum noise absorptivity at a specific frequency, the noise absorber 400 designed such that the frequency corresponding to the maximum coincides with the frequency of the noise absorbing target can achieve more effective noise reduction. It is preferable that the frequency corresponding to the maximum agrees with the frequency of the noise absorbing target. However, even when the two frequencies are not completely the same, sufficient advantages of the invention can be provided as long as 70% or higher of the maximum of the noise absorptivity is produced at the frequency of the noise absorbing target. In the following description, therefore, a frequency band corresponding to 70% or higher of the maximum of the noise absorptivity is defined as an absorbing frequency band, and a noise absorbing structure specialized for a specific frequency band refers to a structure which achieves 70% or higher noise absorptivity for a specific frequency band.

While FIG. 4 shows one opening 401 provided for one cavity 405, the plural openings 401 maybe formed for the one cavity 405. In other words, it is preferable that the length between the adjoining openings 401 is shorter than the length between the adjoining partitioning walls 404. This structure is effective because the front plate 402 is not easily excited by sound waves due to the shorter length between the adjoining partitioning walls 404 than the wavelength of the sound waves at the noise absorbing frequency, in which condition the original noise absorbing performance can be provided by dissipation of energy caused by friction between the air and the part at the openings 401.

The noise absorber thus constructed can serve as a noise-proof cover specialized for a specific frequency by being disposed in such a position as to effectively absorb noise at the specific frequency as shown in the following embodiments, for example.

Examples of the positioning of the noise absorber within the noise-proof cover are now explained. The noise-proof cover contains the apparatus main body such as the scanning electronic microscope, the sample chamber which carries samples, the loading board supporting these components, the frame, and others. The noise-proof cover further includes a power source for operating the apparatus main body, and a control plate in some cases. Thus, the vacant space within the noise-proof cover is limited, wherefore efficient absorption of noise is needed. For this aim, it is important to effectively position the noise absorber which has an absorbing frequency band including a specific frequency in the internal space of the cover.

Therefore, according to the charged particle beam apparatus of the invention, the noise absorber is disposed in the vicinity of an opening of the noise-proof cover as described in the following embodiments. The opening in this context refers to a clearance between the outside of the apparatus and the cover, as an opening provided for the convenience of heat release, piping, and wiring. The position in the vicinity of the opening refers to the range where the effect of absorption of the outside noise entering through the opening can be obtained when the noise absorber is positioned. The effect obtained refers to 70% or higher of the noise absorptivity, for example. Furthermore, a plurality of noise absorbers having different absorbing frequency bands are provided within the noise-proof cover. The different absorbing frequency bands refer to bands of absorbing frequencies corresponding to different maximums, for example.

This structure can decrease the entire volume of the cover, thereby reducing the area required for installation.

The installation position of the noise absorber is now explained while showing specific examples. However, the positioning of the absorber is not limited to the examples shown in the following embodiments. In addition, the following embodiments may be modified or combined.

Embodiment 1

Figure 5:
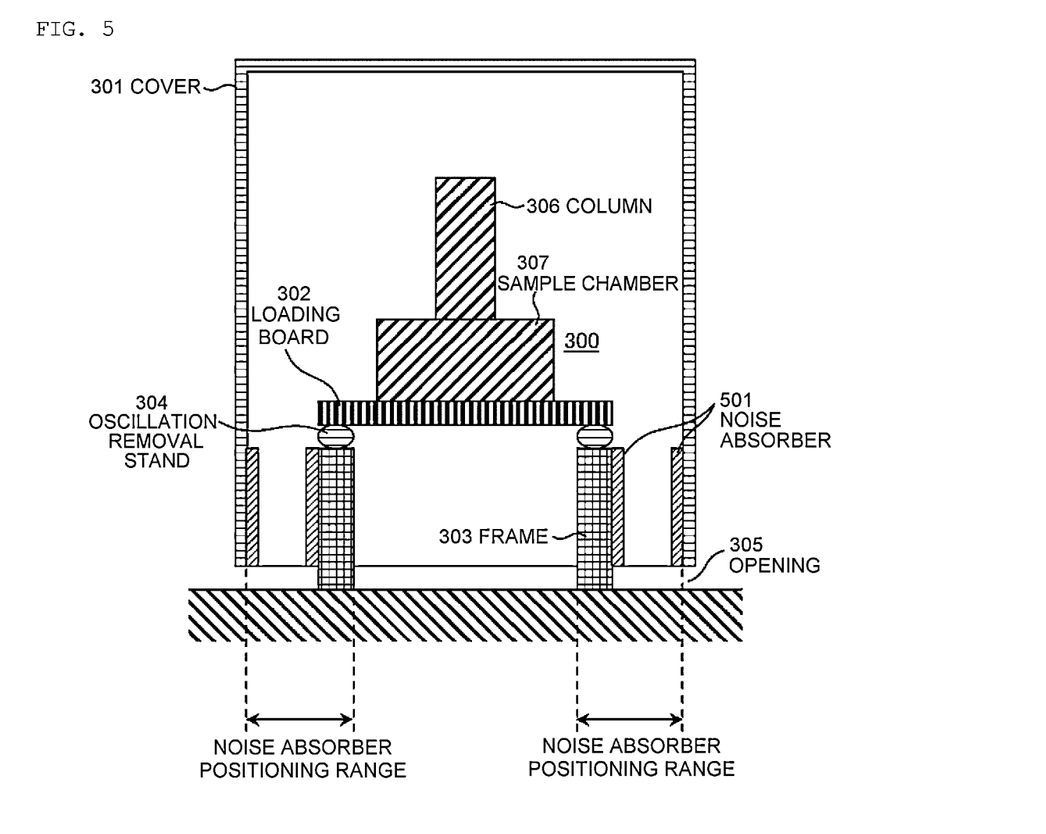
FIG. 5 illustrates an embodiment 1.

FIG. 5 illustrates an example of the positioning of the noise absorber. FIG. 5 illustrates a structure in which a noise absorber 501 is positioned within a space formed between the inner surface of the cover 301 and the supports of the frame 303. It is preferable that the noise absorber 501 has a structure specialized for frequency components close to the natural frequency of the apparatus main body 300.

According to this structure, sound waves which usually leak through the opening 305 located below the cover 301 and enter into the inside therethrough can be absorbed. Particularly, the sound waves having frequency components close to the natural frequency of the apparatus main body 300 can be absorbed by the noise absorber 501 before reaching the apparatus main body 300. As a consequence, the oscillation of the apparatus main body 300 decreases, whereby damage to images lowers.

Moreover, when there exists another opening which allows entrance of the external noise in addition to the opening 305, it is preferable that the noise absorber is also provided around this opening. For example, when an opening through which a cable is inserted is formed in the side surface of the cover 301, the noise absorber is provided in such a manner as to surround this opening.

The installation range of the noise absorber is not particularly limited as long as the range is included in the area shown in FIG. 5. The specific examples of the range are shown in embodiments 2 through 5 described below.

Embodiment 2

Figure 6:
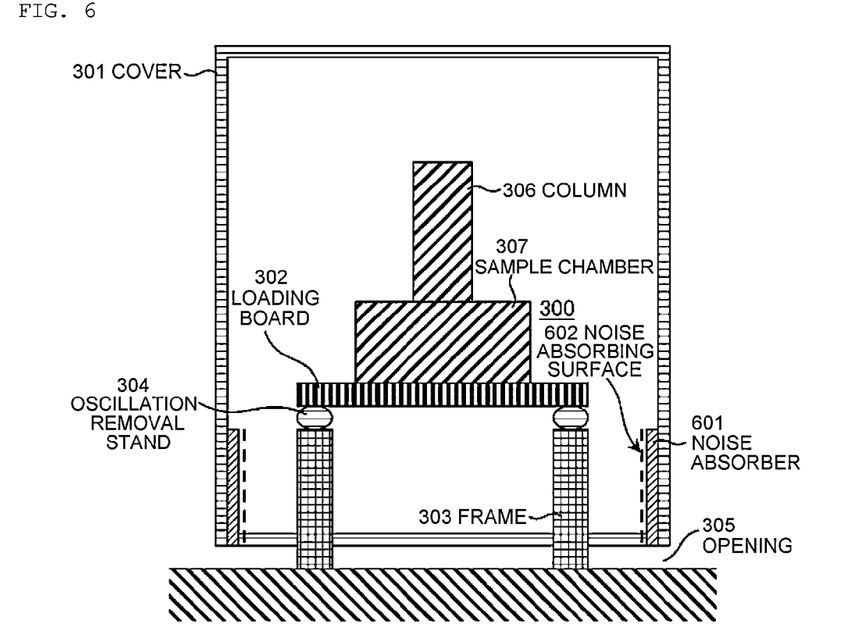
FIG. 6 illustrates an embodiment 2.

FIG. 6 shows one of modified examples of the embodiment 1 shown in FIG. 5. According to this example, a noise absorber 601 is attached to the inside of the cover in the vicinity of the opening 305. Moreover, a noise absorbing surface 602 is disposed in such a position as to face to the inside. The noise absorbing surface refers to the front plate 402 side surface shown in FIG. 4, for example. The inside in this context refers to the side of the space where noise is to be absorbed, that is, the side of the space where the apparatus main body 300 is placed. The condition in which the noise absorber is disposed in the vicinity of the opening 305 refers to the condition of the noise absorber disposed in the range where the effect of absorption of the external noise entering through the opening can be obtained, more particularly, the condition in which a part of the noise absorber faces to at least a part of the opening.

While FIG. 6 only shows the cross section of the noise absorber 601, the noise absorber 601 may be disposed in any condition within the horizontal plane. In other words, the noise absorber 501 may be disposed only on the surface opposed to the frame, or may be provided on the entire circumference in the vicinity of the opening of the cover.

According to this structure, the noise absorbing effect can be obtained more easily than the example shown in the embodiment 1. Moreover, the area required for positioning the noise absorber decreases, wherefore the cost lowers.

Embodiment 3

Figure 7:
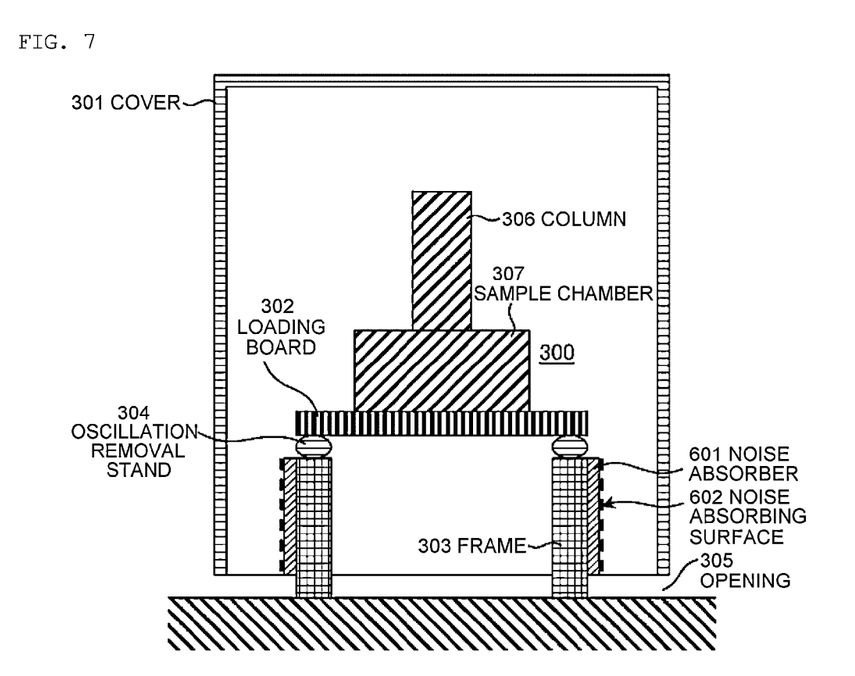
FIG. 7 illustrates an embodiment 3.

FIG. 7 illustrates one of modified examples of the embodiment 1 shown in FIG. 5. According to this example, the noise absorber is attached to the supports constituting the frame 303. Moreover, the noise absorbing surface 602 is disposed in such a position as to face to the inner surface of the cover, that is, the noise absorbing surface 602 is opposed to the cover 301.

According to this embodiment, advantages similar to those of the embodiment 2 can be expected.

Embodiment 4

Figure 8:
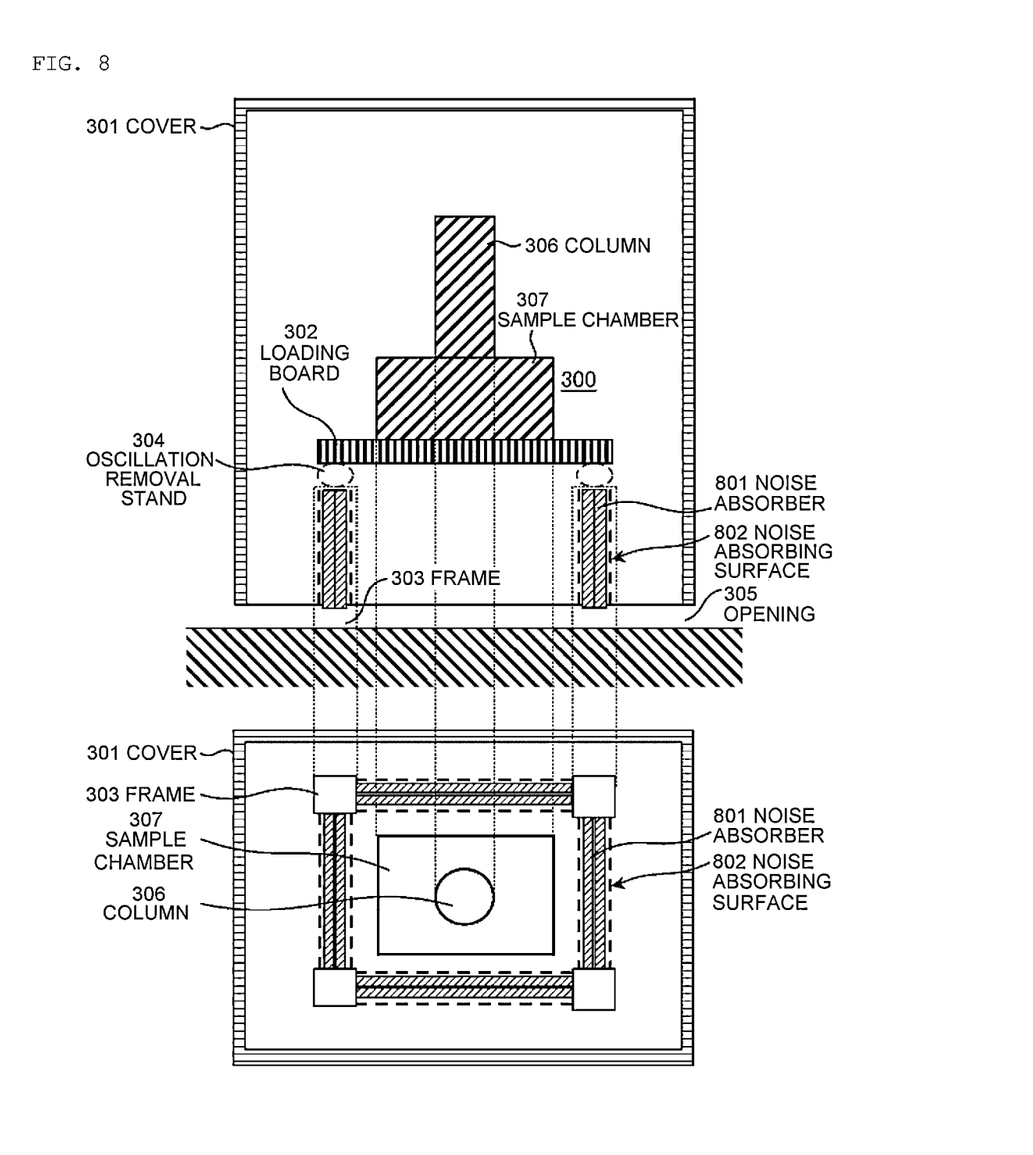
FIG. 8 illustrates an embodiment 4.

FIG. 8 illustrates one of modified examples of the embodiment 1 shown in FIG. 5. This figure shows the cross-sectional view between the adjoining supports shown in FIG. 5, and the top view in such a manner that these views can be easily understood. A noise absorber 801 is disposed in the spaces formed between the adjoining ones of the plural supports constituting the frame 303. In other words, the noise absorber 801 is positioned in a wall shape in such a manner as to connect the adjoining supports. According to this arrangement, the noise absorber can be provided in a larger area than in the embodiment 3. Thus, the noise absorbing effect further improves. Moreover, the limited space within the cover can be effectively utilized. While the noise absorber is provided for the entire spaces between four supports in the example shown in FIG. 8, the noise absorber may be eliminated from a part of the spaces between the plural supports for the convenience of positioning of the apparatus. In this case, the noise absorbing effect decreases from the effect produced when the noise absorber is equipped for the entire spaces between the supports. Thus, it is preferable that the noise absorbing effect is supplemented by the methods shown in the other embodiments.

When the noise absorbing surfaces 802 of the noise absorber 801 are so disposed as to face to both the inside and outside of the space surrounded by the frame 303 as illustrated in FIG. 8, the sound waves within the space surrounded by the supports of the frame 303 can be absorbed as well as the sound waves entering through the opening 305. Accordingly, more excellent effect can be offered. More specifically, a first noise absorbing surface of the noise absorber 801 having a plurality of absorbing surfaces is disposed opposed to the inner surface of the cover 301, while a second noise absorbing surface faces in the same direction as that of the inner surface of the cover 301. As a consequence, the first noise absorbing surface and the second noise absorbing surface are so positioned as to face in the opposite directions as shown in FIG. 8.

As discussed in the embodiments 1 through 4 herein, when the noise absorber which has the absorbing band including the natural frequency of the apparatus main body is provided in the space formed between the inner surface of the cover and the supports of the frame, sound waves usually leaking through the opening 305 located below the cover and entering therethrough can be absorbed by the noise absorber before the frequency components close to the natural frequency of the apparatus main body 300 reaches the main body. Accordingly, oscillation of the apparatus main body 300 decreases, wherefore damage to images lowers.

In the embodiments 1 through 4, the noise absorber which has the absorbing frequency band including the natural frequency of the apparatus main body has been discussed. However, the noise absorber is not limited to the noise absorber specialized for the natural frequency, but may be other types of noise absorbers as long as they are specialized for a specific frequency, such as the frequency of acoustic standing waves as explained below with reference to FIG. 9.

Embodiment 5

Figure 9:
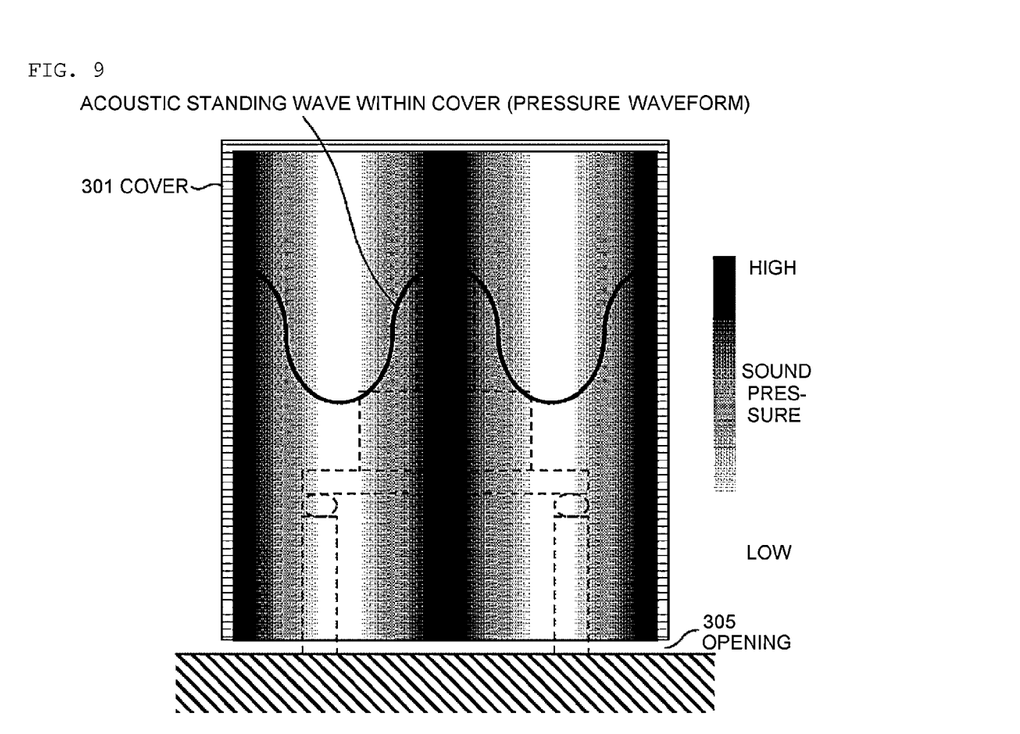
FIG. 9 illustrates acoustic standing waves generated within the cover.

An example which positions two types of noise absorbers performing different operations within the noise-proof cover is now explained with reference to FIG. 10. According to the noise-proof cover for the charged particle beam apparatus or the like, acoustic standing waves shown in FIG. 9 are generated in the space surrounded by the cover 301. The generated acoustic standing waves range from about 100 to 500 Hz, which is lower than the natural frequency of the typical charged particle beam apparatus main body 300 including the cover 301 and the loading board 302. In the embodiments 1 through 4, the positioning of the noise absorber specialized for the natural frequency of the apparatus has been discussed. However, the structures explained above are difficult to efficiently absorb the acoustic standing waves due to the difference in the noise absorbing frequency. For providing noise absorbing performance specialized for low frequencies, the thickness of the noise absorbing material needs to increase. However, according to a typical charged particle beam apparatus, there is often provided other equipment below the loading board 302. In this case, the space for positioning the noise absorber is difficult to be obtained. However, on the side above the loading board 302 in the vertical direction, there is a relatively wide space larger than the space below the loading board 302. Thus, when positioned in the upper space, the noise absorber can be made thicker than the noise absorber discussed in the embodiments 1 through 4.

Figure 10:
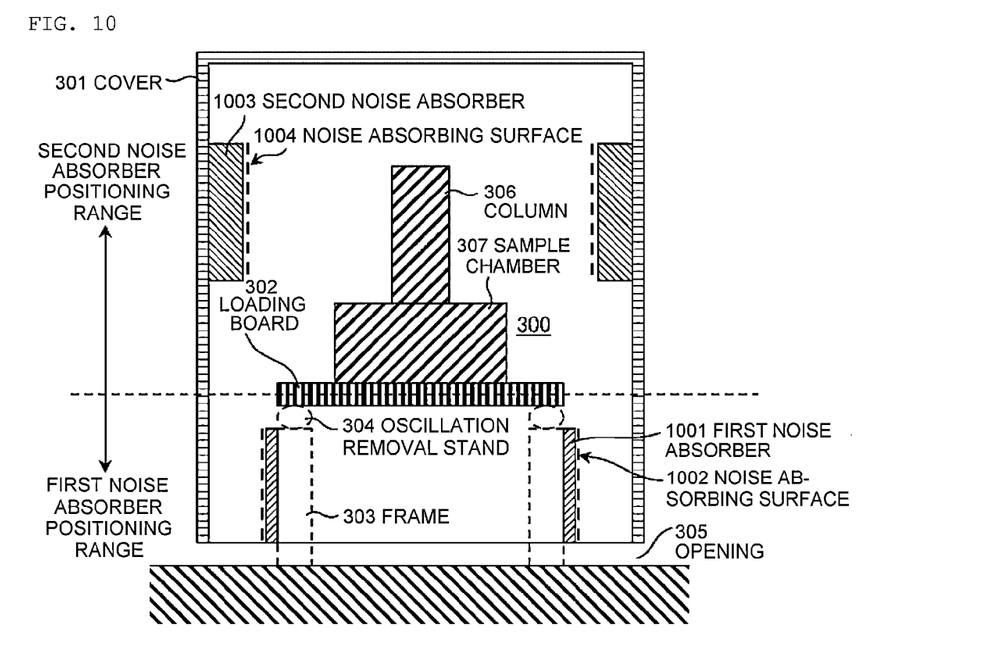
FIG. 10 illustrates an embodiment 5.

Accordingly, a second noise absorber 1003 providing noise absorbing performance specialized for the frequency of the acoustic standing waves within the cover is disposed on the inner side of the cover above the loading board 302 in the vertical direction as illustrated in FIG. 10. The second noise absorber 1003 may be provided inside the noise-proof cover at any position where a sufficient space for the second noise absorber 1003 can be secured. As noted above, the area above the loading board often has a sufficient vacant space. Thus, it is preferable that the second noise absorber 1003 is positioned on the inner surface of the noise-proof cover in the area above the plane defined by the loading board. For example, the second noise absorber 1003 may be disposed on the ceiling surface of the cover 301.

The opening diameter, opening length, porosity, cavity size, and other conditions of the second noise absorber 1003 are so determined as to have an absorbing frequency band different from that of a first noise absorber 1001 specialized for the natural frequency of the apparatus.

When the two types of noise absorbers providing different operations are disposed inside of the cover, noises having different frequencies can be simultaneously absorbed. Thus, more excellent noise absorbing effect can be expected. Moreover, the first noise absorber having a high absorbing frequency band is disposed in the vicinity of the opening 305 of the cover 301, while the second absorber having a low absorbing frequency band is disposed away from the opening 305 of the cover 301. In this case, the noise absorbers can be efficiently positioned within the limited space. Accordingly, space saving of the entire apparatus improves.

According to this embodiment, the example which positions the second noise absorber 1003 in conjunction with the first noise absorber 1001 specialized for the natural frequency of the apparatus has been discussed. However, when the oscillation at the natural frequency does not cause problems, only the second noise absorber 1003 specialized for a frequency of the first acoustic standing waves may be equipped.

According to this embodiment, the second noise absorber 1003 has a structure specialized for the frequency of the acoustic standing waves. However, the second noise absorber 1003 may have a structure specialized for a frequency of another noise source.

In embodiments 6 and 7 described below as other modified examples, structures of the charged particle beam apparatus including a sample transfer device 1102, such as a semiconductor measuring, inspecting, and observing device as a typical example, will be discussed.

Embodiment 6

Figure 11:
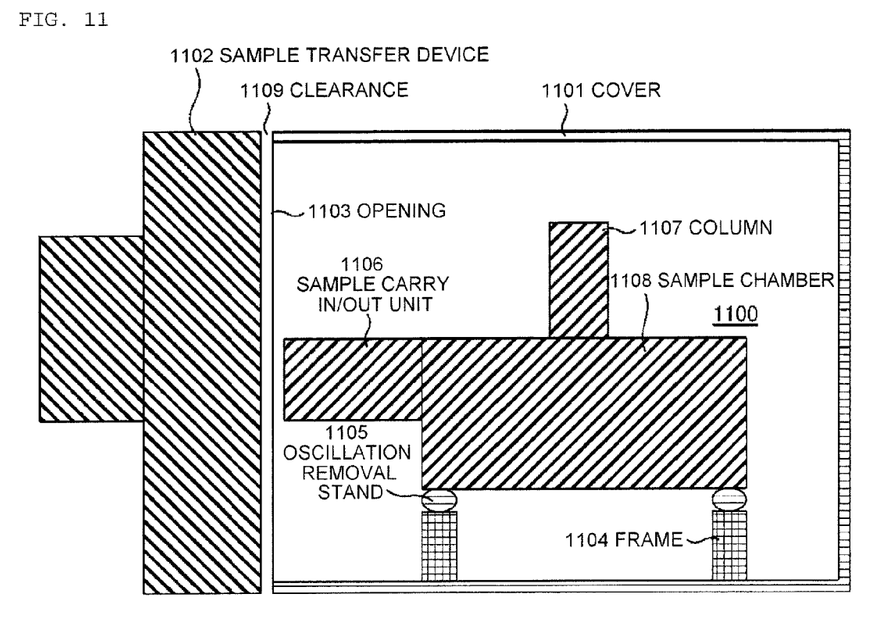
FIG. 11 is a cross-sectional view of a charged particle beam apparatus including a sample transfer device.

FIG. 11 illustrates a typical charged particle beam apparatus including a cover 1101 and a sample transfer device 1102. As can be seen from FIG. 11, the cover 1101 has an opening 1103 where one side of the cover 1101 is completely open. A frame 1104 having a plurality of supports is disposed on the bottom surface of the cover 1101. A charged particle beam apparatus main body 1100 is fixed to the upper part of the frame 1104 via oscillation removal stands 1105 and others. The apparatus main body 1100 is covered by the cover in directions other than the opening 1103 side. A sample carry in/out unit 1106 is disposed on the opening 1103 side. Apart from this component, there is provided a unit called the sample transfer device 1102 which transfers a sample into the apparatus main body 1100 via the sample carry in/out unit 1106. This sample transfer device 1102 is disposed in front of the opening 1103 of the cover 1101 in such a position as to close the opening 1103.

Figure 12:
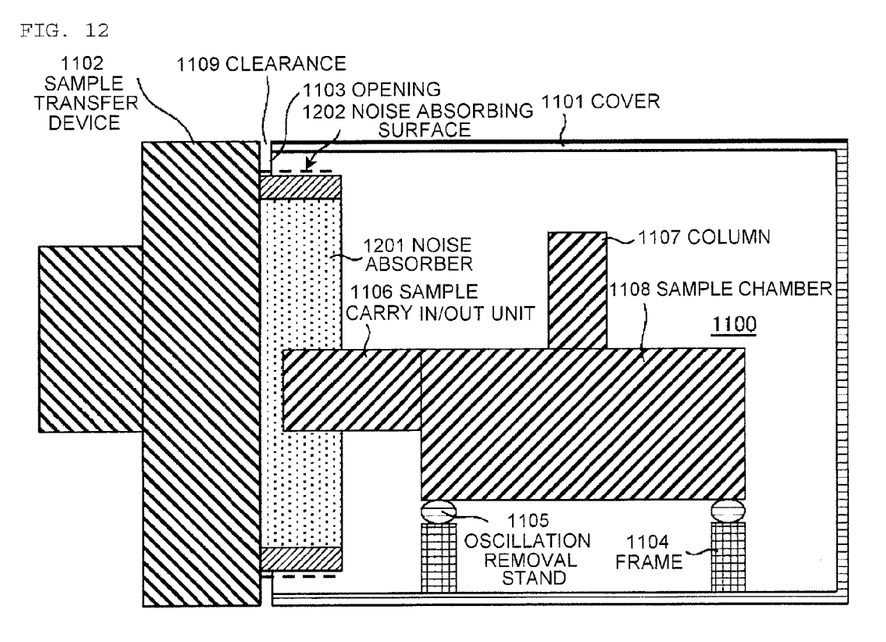
FIG. 12 illustrates an embodiment 6.

FIG. 12 illustrates an example which attaches a noise absorbing structure to the charged particle beam apparatus provided with the cover and the sample transfer device 1102 explained with reference to FIG. 11. This example has a structure a noise absorber 1201 is positioned in such a condition that the noise absorber 1201 projects from the wall surface of the sample transfer device 1102 on the side opposed to the opening 1103 through the opening 1103 toward the apparatus main body 1100.

In this case, a noise absorbing surface 1202 is disposed substantially perpendicular to the wall surface of the sample transfer device 1102 on the apparatus main body side and substantially parallel with the ceiling surface or the floor surface of the cover 1101. When positioned in this manner, the noise absorbing surface 1202 is located in a clearance 1109 between the cover 1101 and the sample transfer device 1102 in such a position as to face to the outside of the cover. Accordingly, noise entering from the outside of the clearance 1109 can be effectively absorbed.

For efficient noise absorption, the length of the noise absorbing surface 1202 extending in the direction perpendicular to the wall surface of the sample transfer device 1102 on the apparatus main body side needs to be at least longer than the length of the clearance 1109 in the same direction such that the noise absorbing surface 1202 can project to the inside of the cover 1101.

According to this structure, the sound waves leaking through the clearance between the cover 1101 and the sample transfer device 1102 and entering through the opening 1103 into the inside can be absorbed by the noise absorber 1201 before frequency components close to the natural frequency of the apparatus main body 1100 reach the apparatus main body 1100. As a result, the oscillation of the apparatus main body 1100 decreases, wherefore damage to images lowers.

Figure 13:
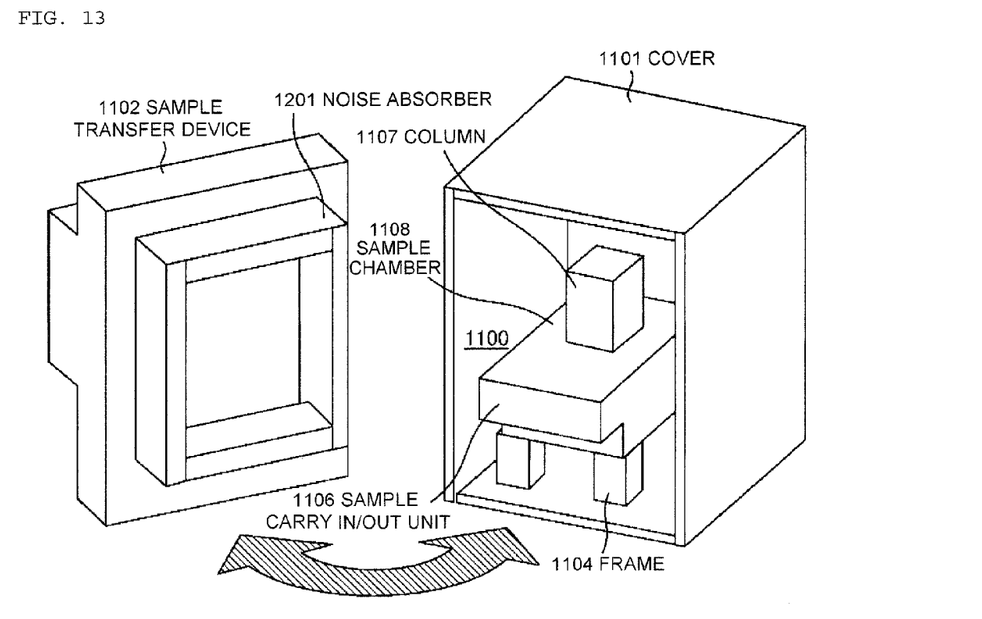
FIG. 13 illustrates the structure described in the embodiment 6 and shown in three dimensions.

FIG. 13 illustrates the separated condition of the cover 1101 and the sample transfer device 1102 shown in FIG. 12 in three dimensions. FIG. 13 shows an example of the noise absorber 1201 attached to the sample transfer device 1102. However, the noise absorber 1201 may be formed integrally with the wall surface of the sample transfer device. The noise absorber 1201 may be fixed to the cover 1101 or the sample carry in/out unit 1106. The noise absorber 1201 may be fixed to the floor surface of the cover independently from the sample transfer device 1102 and the cover 1101.

Embodiment 7

Figure 14:
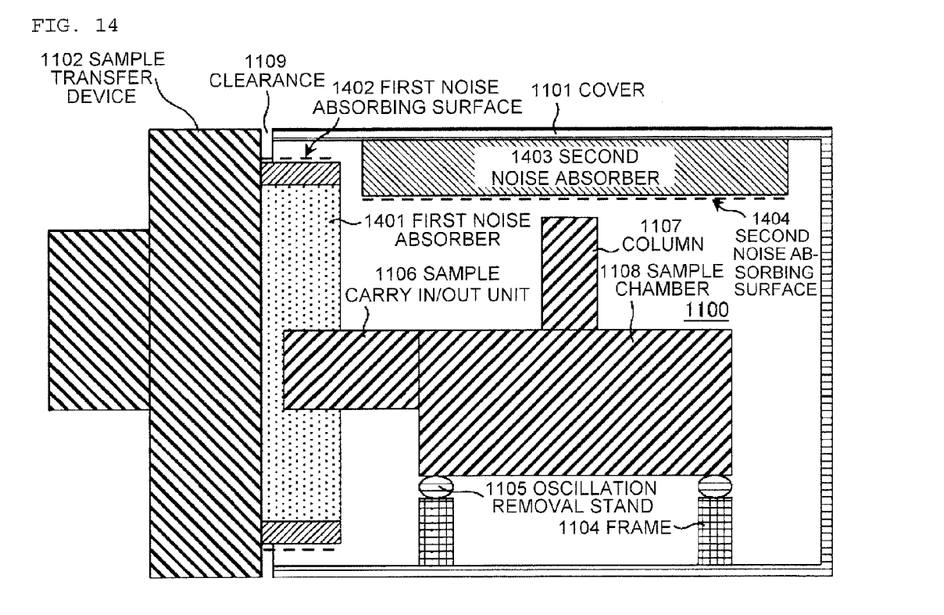
FIG. 14 illustrates an embodiment 7.

According to an embodiment shown in FIG. 14, a second noise absorber 1403 which provides noise absorbing performance specialized for the frequency of the acoustic standing waves generated within the cover is further positioned on the inside of the ceiling surface of the cover 1101 in the structure of the embodiment 6 explained with reference to FIG. 12. The installation position of the second noise absorber 1403 is not limited to the ceiling surface of the cover 1101, but may be located on the cover side surface. According to this embodiment, noises in different frequency bands can be also absorbed by positioning the two types of noise absorbers providing different operations within the cover in the manner similar to the embodiment 5. Accordingly, further excellent noise absorbing effect can be expected.

As apparent from above, the metal noise absorber can be efficiently positioned within the limited space inside the cover when disposed in the manner shown in the respective embodiments or combinations thereof. Accordingly, the noise-proof cover applicable to the charged particle beam apparatus and capable of providing excellent noise absorbing effect can be constructed without considerably increasing the weight, installation space, and cost.

REFERENCE SIGNS LIST 300, 1100 apparatus main body
400 noise absorber

The invention claimed is:

1. A charged particle beam apparatus, comprising:
an apparatus main body which has at least a scanning electron microscope capturing an image of a sample; and
a cover provided around the apparatus main body,
wherein a noise absorber which has a noise absorbing frequency band including the natural frequency of the apparatus main body, or the frequency of acoustic standing waves generated within the cover is provided within the cover.

2. The charged particle beam apparatus as set forth in claim 1, wherein
the apparatus main body has a loading board which supports the scanning electron microscope, and a frame which has a plurality of supports supporting the loading board; and the noise absorber is disposed between the cover and the supports.

3. The charged particle beam apparatus as set forth in claim 2, wherein the noise absorber is disposed inside the cover or on the supports.

4. The charged particle beam apparatus as set forth in claim 2, wherein the noise absorber is disposed between the plural supports forming the frame.

5. The charged particle beam apparatus as set forth in claim 1, wherein the noise absorber has a plurality of noise absorbing surfaces.

6. The charged particle beam apparatus as set forth in claim 1, wherein the noise absorber is made of metal material.

7. The charged particle beam apparatus as set forth in claim 6, wherein
the noise absorber has a porous plate having a plurality of openings; and
each length of the openings is variable.

8. The charged particle beam apparatus as set forth in claim 6, wherein
the noise absorber includes a porous plate having a plurality of openings, a back plate provided opposed to the porous plate, and a plurality of partitioning plates partitioning a cavity formed between the porous plate and the back plate; and
each length between the partitioning plates is shorter than the wavelength of sound waves in the noise absorbing frequency band of the noise absorber.

9. The charged particle beam apparatus as set forth in claim 1, further comprising:
a sample transfer device provided at a position opposed to a sample carry in/out unit of the apparatus main body, wherein
the cover has an opening on the surface opposed to the sample carry in/out unit of the apparatus main body, and
the noise absorber is so disposed as to project from the wall surface of the sample transfer device on the apparatus main body side through the opening toward the apparatus main body.

10. The charged particle beam apparatus as set forth in claim 9, wherein the noise absorber is disposed substantially perpendicular to the wall surface of the sample transfer device on the apparatus main body side, and substantially parallel with the ceiling surface of the cover.

11. The charged particle beam apparatus as set forth in claim 9, wherein a noise absorbing surface of the noise absorber is disposed opposed to the inner surface of the cover.

12. A charged particle beam apparatus, comprising:
an apparatus main body which has at least a scanning electron microscope capturing an image of a sample; and
a cover so disposed as to cover the side surface and the ceiling surface of the apparatus main body, wherein
a first noise absorber and a second noise absorber having different noise absorbing frequency bands are provided within the cover.

13. The charged particle beam apparatus as set forth in claim 12, wherein
the first noise absorber has a noise absorbing frequency band including a first frequency range corresponding to the natural frequency of the apparatus main body; and
the second noise absorber has a noise absorbing frequency band including a second frequency range corresponding to the frequency of acoustic standing waves generated within the cover.

14. The charged particle beam apparatus as set forth in claim 12, wherein
the apparatus main body has a loading board which supports the scanning electron microscope, and a frame which has a plurality of supports supporting the loading board; and
the first noise absorber is disposed between the cover and the supports.

15. The charged particle beam apparatus as set forth in claim 14, wherein the first noise absorber is disposed inside the cover or on the supports.

16. The charged particle beam apparatus as set forth in claim 14, wherein the first noise absorber is disposed between the plural supports forming the frame.

17. The charged particle beam apparatus as set forth in claim 12, wherein the first noise absorber has a plurality of noise absorbing surfaces.

18. The charged particle beam apparatus as set forth in claim 14, wherein
the first noise absorber is disposed below the loading board; and
the second noise absorber is disposed above the loading board.

19. The charged particle beam apparatus as set forth in claim 12, wherein the first noise absorber or the second noise absorber is made of metal material.

20. The charged particle beam apparatus as set forth in claim 19, wherein
the first noise absorber or the second noise absorber includes a porous plate having a plurality of openings; and
each length of the openings is variable.

21. The charged particle beam apparatus as set forth in claim 19, wherein
the first noise absorber or the second noise absorber includes a porous plate having a plurality of openings, a back plate provided opposed to the porous plate, and a plurality of partitioning plates partitioning a cavity formed between the porous plate and the back plate; and
each length between the partitioning plates is shorter than the wavelength of sound waves in the noise absorbing frequency band of the first noise absorber or the second noise absorber.

* * * * *